United States Patent
Xu et al.

(10) Patent No.: US 10,403,558 B2
(45) Date of Patent: Sep. 3, 2019

(54) POWER MODULE WITH MULTI-LAYER SUBSTRATE

(71) Applicant: Ford Global Technologies, LLC, Dearborn, MI (US)

(72) Inventors: Fan Xu, Novi, MI (US); Lihua Chen, Farmington Hills, MI (US); Sadashi Seto, Novi, MI (US); Shuitao Yang, Canton, MI (US); Yan Zhou, Canton, MI (US); Baoming Ge, Okemos, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 93 days.

(21) Appl. No.: 15/684,697

(22) Filed: Aug. 23, 2017

(65) Prior Publication Data

US 2019/0067160 A1 Feb. 28, 2019

(51) Int. Cl.
| | | |
|---|---|---|
| *H01L 23/00* | (2006.01) | |
| *H01L 23/373* | (2006.01) | |
| *H01L 25/18* | (2006.01) | |
| *H02M 7/00* | (2006.01) | |
| *H02P 27/06* | (2006.01) | |

(52) U.S. Cl.
CPC ......... *H01L 23/3735* (2013.01); *H01L 24/48* (2013.01); *H01L 25/18* (2013.01); *H02M 7/003* (2013.01); *H01L 2224/48225* (2013.01); *H01L 2924/10253* (2013.01); *H01L 2924/10272* (2013.01); *H01L 2924/1203* (2013.01); *H01L 2924/13055* (2013.01); *H01L 2924/13091* (2013.01); *H01L 2924/14252* (2013.01); *H01L 2924/15747* (2013.01); *H02P 27/06* (2013.01)

(58) Field of Classification Search
CPC ............ H01L 21/4871; H01L 23/3735; H01L 23/473; H01L 24/48; H01L 25/18; H01L 27/0664; H01L 29/7397; H02M 7/003; H02M 3/155
USPC .......................................................... 257/703
See application file for complete search history.

(56) References Cited

U.S. PATENT DOCUMENTS

| | | | |
|---|---|---|---|
| 5,601,932 A | 2/1997 | Krum et al. | |
| 9,559,042 B2 | 1/2017 | Nakamura | |
| 2010/0230800 A1* | 9/2010 | Beaupre | H01L 23/3735 257/691 |
| 2017/0178997 A1* | 6/2017 | Strawbridge | H01L 23/3735 |

FOREIGN PATENT DOCUMENTS

CN 204046434 U 12/2014

\* cited by examiner

*Primary Examiner* — Brook Kebede
(74) *Attorney, Agent, or Firm* — David B. Kelley; Brooks Kushman P.C.

(57) ABSTRACT

A power system has a single-side-cooled power module including a contiguous five-layer substrate of two insulative layers interleaved with three conductive layers. A center one of the conductive layers is partitioned to define discrete spaced apart positive terminal and output terminal portions, and an outer of the conductive layers defines a negative terminal portion such that the positive terminal and negative terminal portions overlap. The power system also has semiconductors respectively in direct contact with the positive terminal and output terminal portions without directly contacting the other layers.

20 Claims, 5 Drawing Sheets

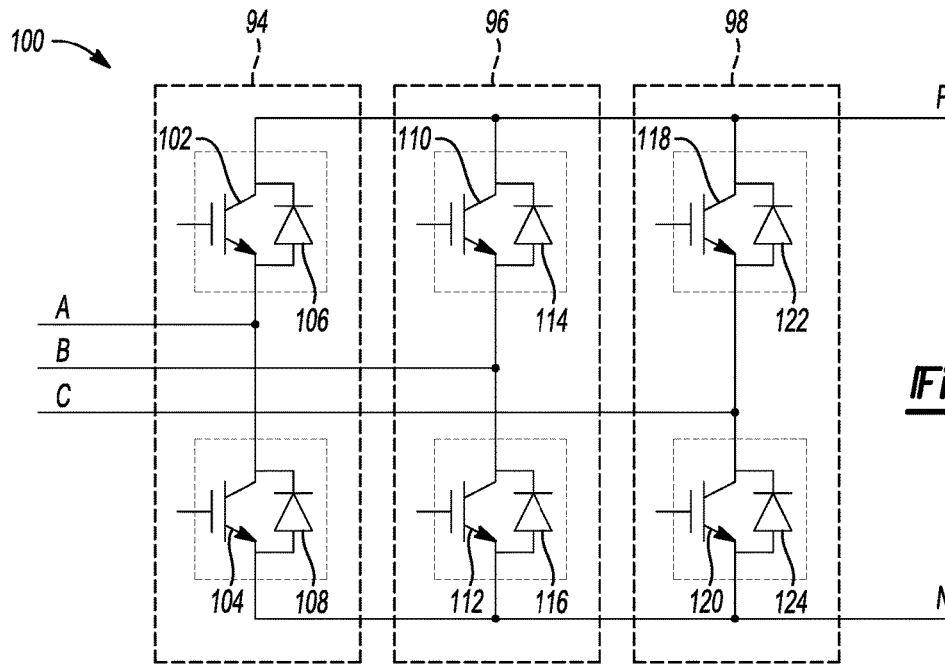
_Fig-5_
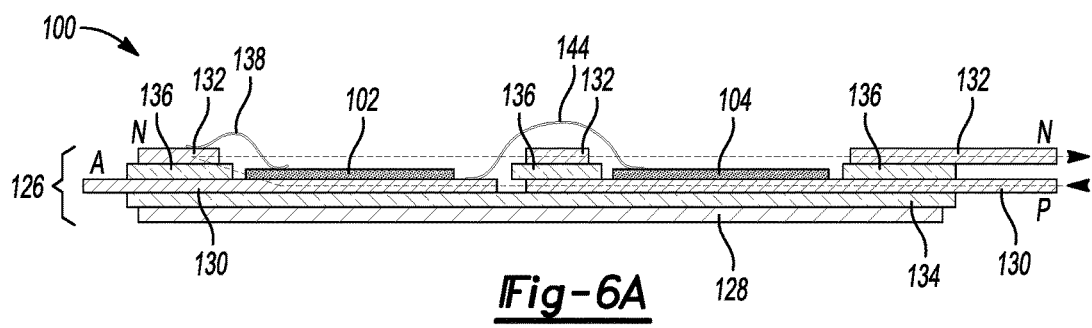
_Fig-6A_
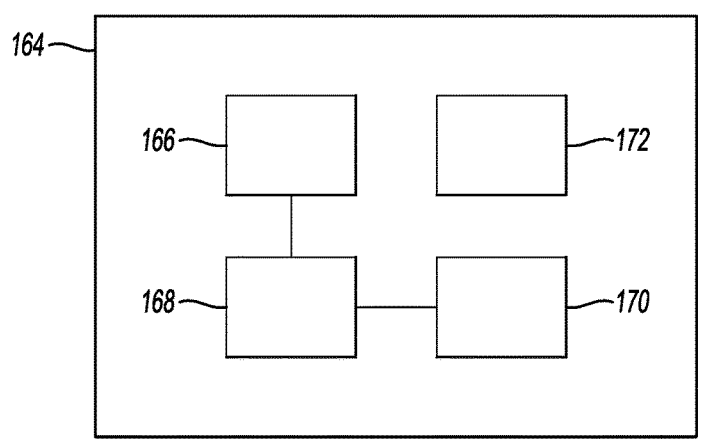
_Fig-7_

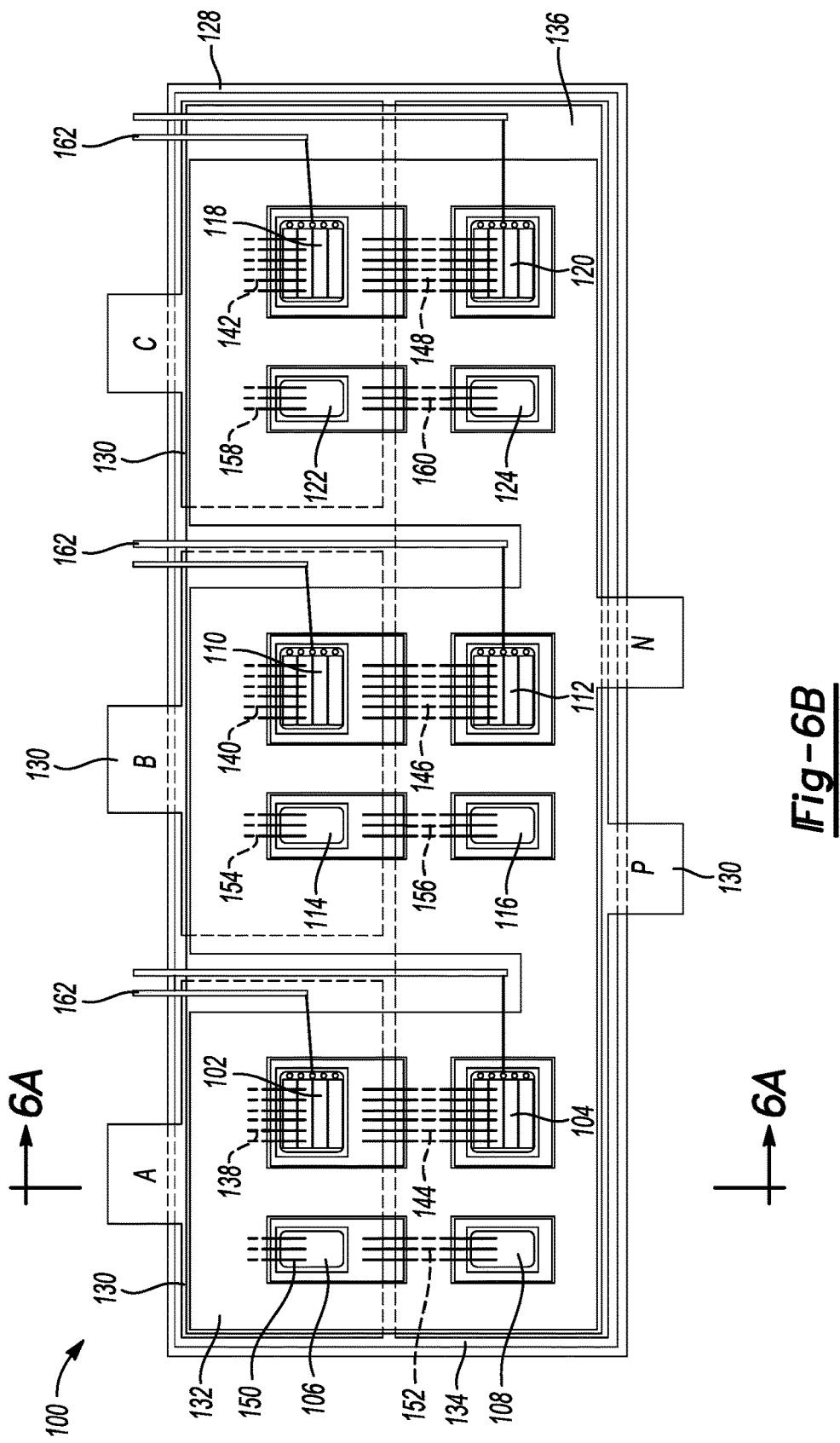

US 10,403,558 B2

POWER MODULE WITH MULTI-LAYER SUBSTRATE

TECHNICAL FIELD

This disclosure relates to the layout and electrical connection of solid state transistors to multi-layer substrates.

BACKGROUND

Electrified vehicles including hybrid-electric vehicles (HEVs) and battery electric vehicles (BEVs) rely on a traction battery to provide power to a traction motor for propulsion and a power inverter therebetween to convert direct current (DC) power to alternating current (AC) power. The typical AC traction motor is a 3-phase motor that may be powered by 3 sinusoidal signals each driven with 120 degrees phase separation. Also, many electrified vehicles include a DC-DC converter to convert the voltage of the traction battery to an operational voltage level of the electric machine. These various components may include solid state transistors.

SUMMARY

A power system comprises a single-side-cooled power module including a contiguous five-layer substrate of two insulative layers interleaved with three conductive layers. A center one of the conductive layers is partitioned to define discrete spaced apart positive terminal and output terminal portions. An outer of the conductive layers defines a negative terminal portion such that the positive terminal and negative terminal portions overlap. The power system further comprises semiconductors being respectively in direct contact with the positive terminal and output terminal portions without directly contacting the other layers, and respective sets of wires interconnecting the output terminal portion and the semiconductor in direct contact with the positive terminal portion, and interconnecting the negative terminal portion and the semiconductor in direct contact with the output terminal portion.

A power module comprises semiconductors mounted on a contiguous five-layer substrate of two insulative layers interleaved with three conductive layers. A center one of the conductive layers is partitioned to define discrete spaced apart positive terminal and output terminal portions. An outer of the conductive layers defines a negative terminal portion. And, the semiconductors are respectively in direct contact with the positive terminal and output terminal portions without directly contacting the other layers.

A power system comprises a single-side-cooled power module including three conductive layers alternating with two insulative layers to form a substrate. A center layer of the substrate is discretely partitioned into two portions and two semiconductors are respectively directly in contact with the two portions such that a positive terminal portion defined by one of the two portions overlaps a negative terminal portion defined by an outer most of the layers.

BRIEF DESCRIPTION OF THE DRAWINGS

FIG. 5 is a schematic diagram of three half-bridge cells arranged to form a full three-phase converter.
FIGS. 6A and 6B are side and plan views of the full three-phase converter of FIG. 5 implemented with a five-layer substrate.
FIG. 7 is a schematic diagram of portions of an automotive vehicle.

DETAILED DESCRIPTION

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

Figure 1:
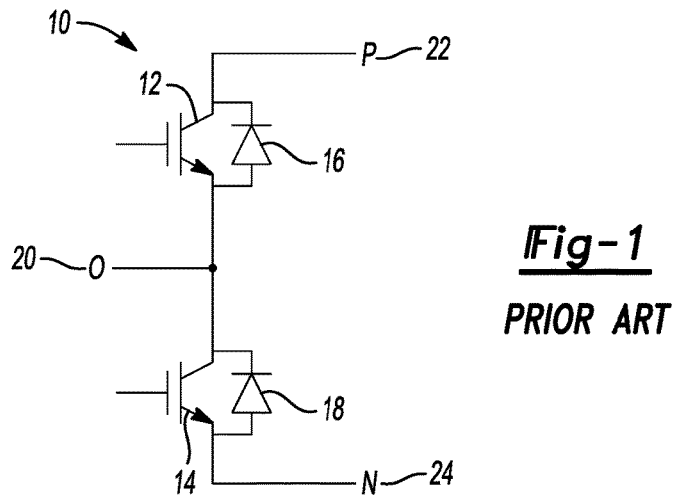
FIG. 1 is a schematic diagram of a half-bridge cell.

The half-bridge is a common cell used in power electronics circuits. Referring to FIG. 1, a typical half-bridge 10 includes two active power devices 12, 14 (e.g., power insulated gate bipolar transistors (IGBTs) or power metal-oxide-semiconductor field-effect transistors (MOSFETs)), two power diodes 16, 18 (separate from or integrated with the IGBTs/MOSFETs), and respective terminals 20, 22, 24, (O terminal, P terminal and N terminal). One or multiple half-bridges may be packaged in a power module. And one or multiple power modules may be used in a traction inverter for vehicle applications.

In each power module, stray inductance associated with the power loop (the current path from the P terminal 22 to the terminal N 24) and induced by magnetic fields of the busbar and copper traces should be minimized to reduce voltage overshoot during power device turn-off transients, and thus reduce power loss and avoid power device overvoltage breakdown. This voltage overshoot will increase as the power devices switch faster. So the minimization of stray inductance can be important for power module design, especially for Silicon Carbide (SiC) based power modules, which can switch faster than corresponding Silicon (Si) based devices.

Figure 2A:
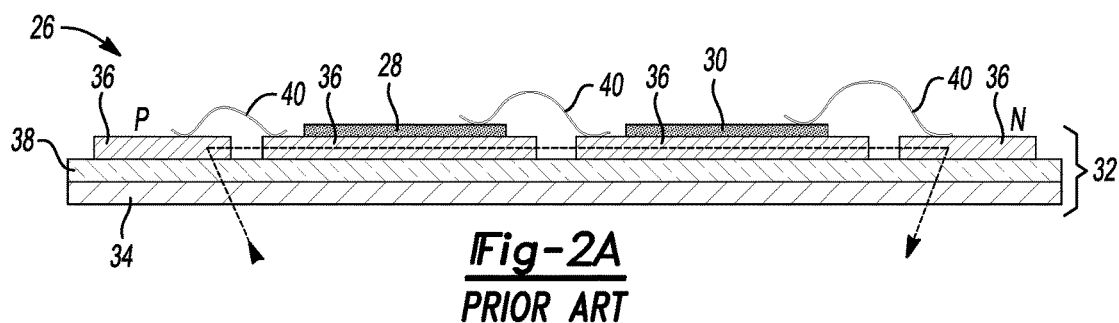
FIGS. 2A and 2B are side and plan views respectively of a prior art single-side-cooled power module.
Figure 2B:
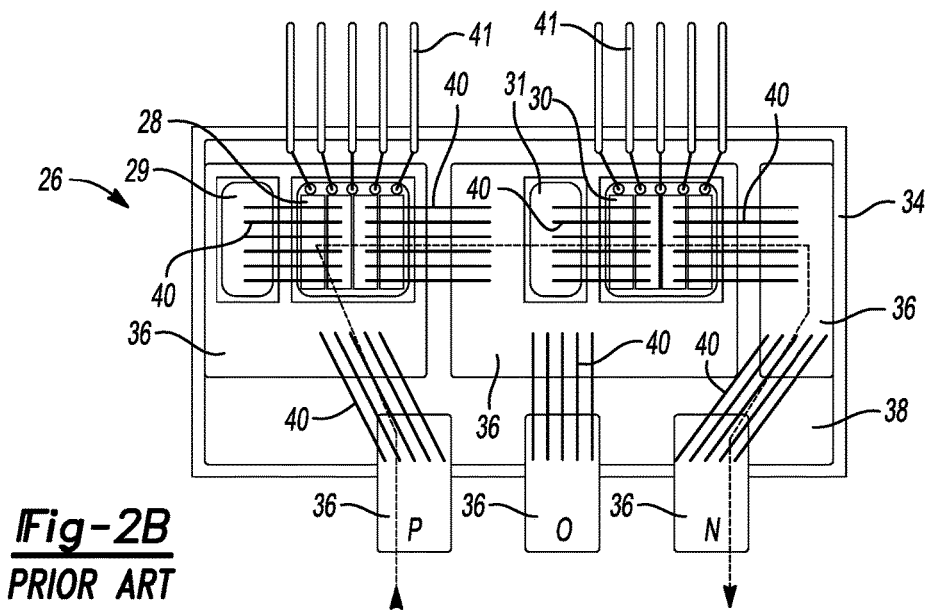

With reference to FIGS. 2A and 2B, a traditional single-side-cooled half-bridge power module 26 has power devices 28, 30 and diodes 29, 31 attached on a substrate 32, which is usually direct bond copper. For ease of understanding, the side view of FIG. 2A shows relationships between the various components but does not necessarily represent the exact placement of these components relative to one another. The substrate 32 includes two copper layers 34, 36 sandwiching an insulative ceramic layer 38. Wirebond or ribbon 40 electrically interconnects the P, O, and N terminals of the copper layer 36, the power devices 28, 30, and the diodes 29, 31. And, control pins 41 are electrically connected with the power devices 28, 30 as per usual. The dashed line indicates the rather lengthy stray-inductance-susceptible power loop from the P terminal to the N terminal.

Figure 3A:
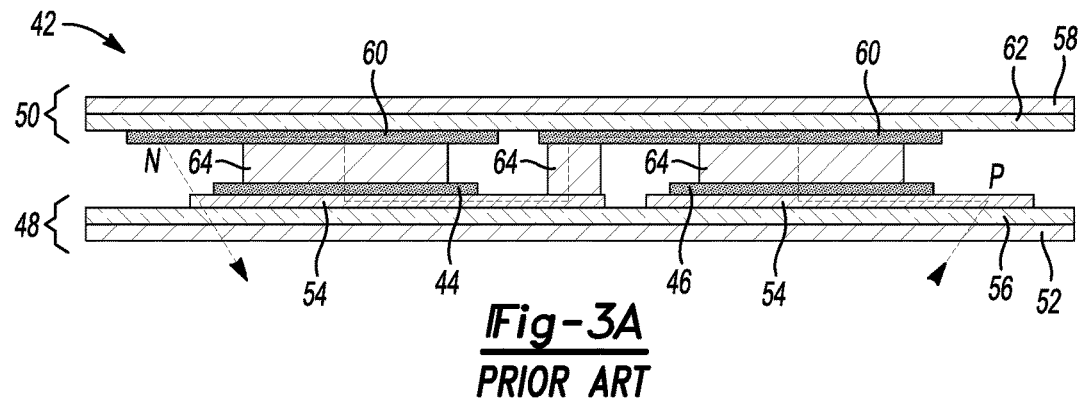
FIGS. 3A and 3B are side and plan views respectively of a prior art double-side-cooled power module.
Figure 3B:
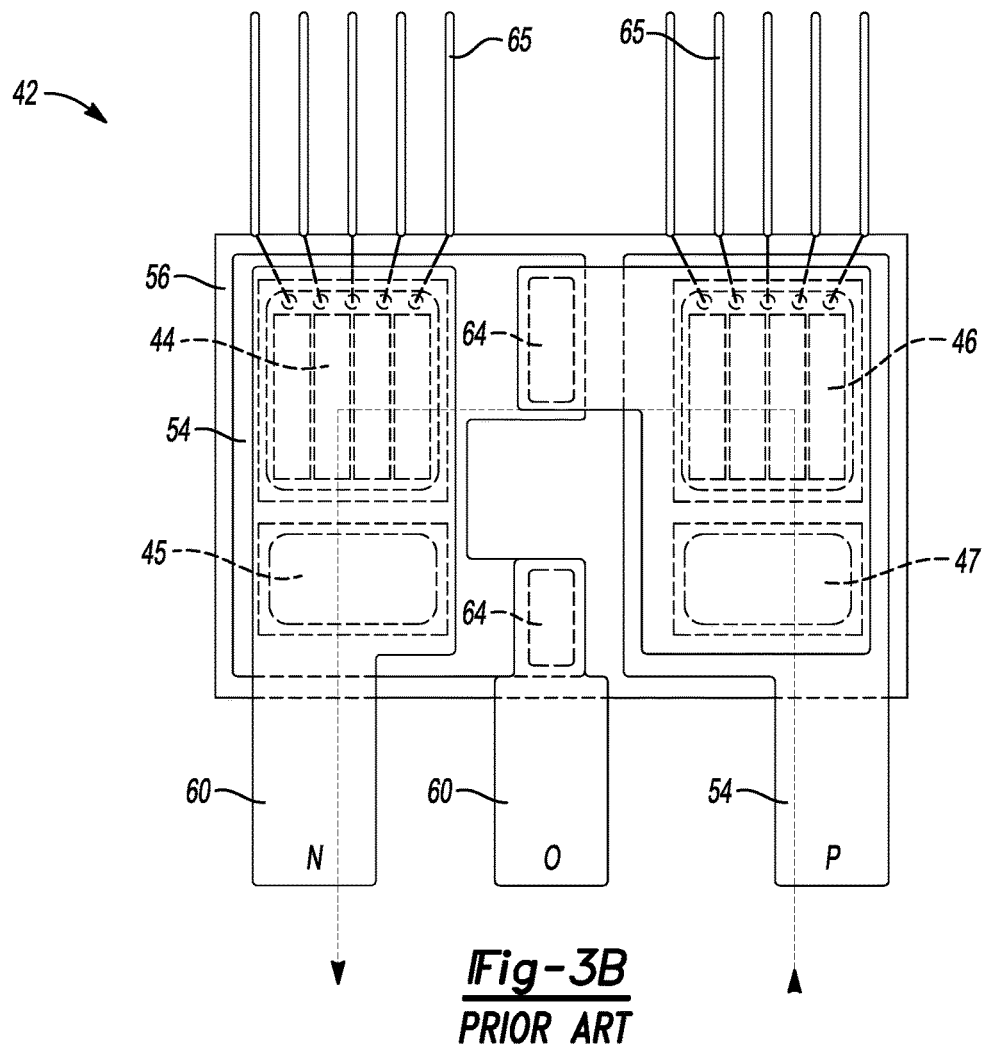

With reference to FIGS. 3A and 3B, a traditional double-side-cooled power module 42 has power devices 44, 46 and diodes 45, 47 attached between substrates 48, 50. For ease of understanding, the side view of FIG. 2A shows relationships between the various components but does not necessarily represent the exact placement of these components relative to one another. Moreover, FIG. 3B does not show the substrate 50. Like the substrate 32, the substrate 48 includes two copper layers 52, 54 sandwiched between an insulative ceramic layer 56. And, the substrate 50 includes two copper layers 58, 60 sandwiched between an insulative ceramic layer 62. Copper spacers 64, as the name suggests, space the power devices 44, 46 away from the substrate 50. And, control pins 65 are electrically connected with the power devices 44, 46 as per usual. Again, the dashed line indicates the rather lengthy power loop.

It has been discovered that increasing the number of layers of the substrate permits power loop configurations with reduced effective length and overlapping portions, which can reduce stray inductance and associated voltage overshoot and power loss. In one example, a power module can use a substrate having two insulative layers interleaved with three metal layers.

Figure 4A:
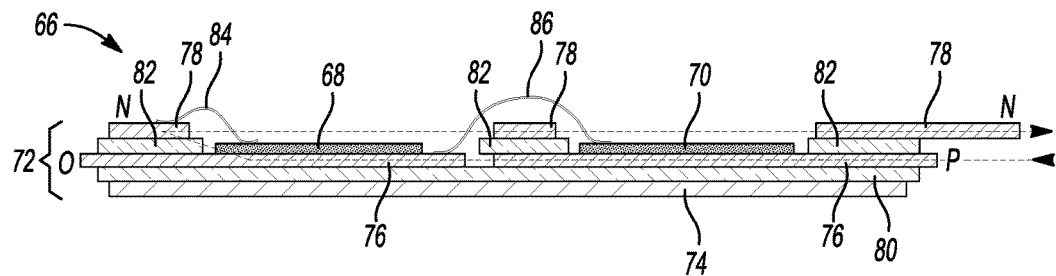
FIGS. 4A and 4B are side and plan views respectively of a single-side-cooled power module with a five-layer substrate.
Figure 4B:
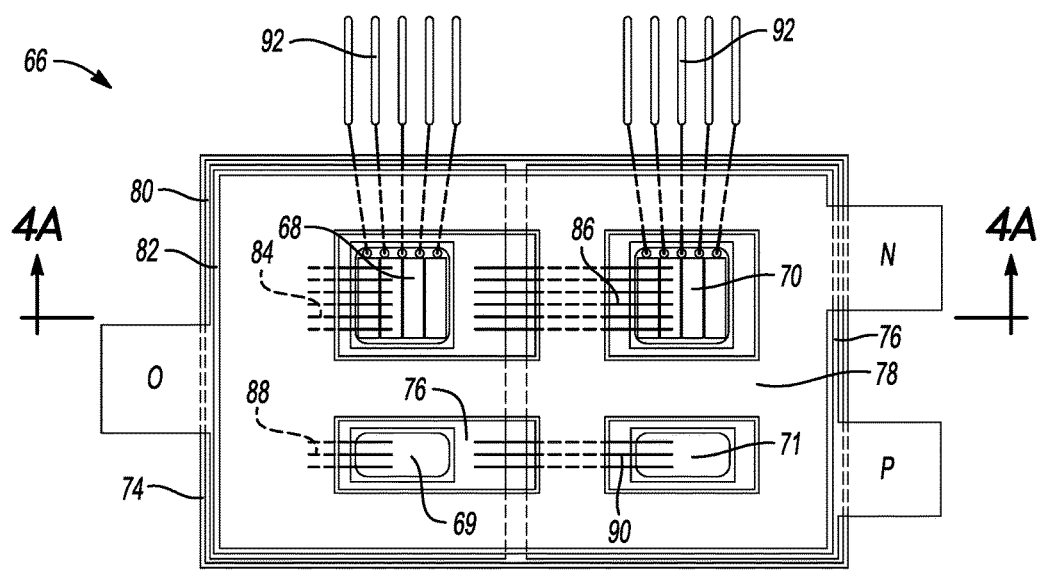

With reference to FIGS. 4A and 4B, a single-side-cooled half bridge power module 66 has power devices 68, 70 and diodes 69, 71 attached on a substrate 72. The substrate 72 includes three metal (e.g., copper) layers 74, 76, 78 and two insulative (e.g., ceramic) layers 80, 82. These five layers are contiguous in that any one layer directly contacts other adjacent layers of the substrate 72. The ceramic layer 80 is sandwiched between the copper layers 74, 76, and the ceramic layer 82 is sandwiched between the copper layers 76, 78. Specifically, the power devices 68, 70 are attached on the copper layer 76, which is partitioned into discrete separated portions: One portion serves as the O terminal and the other portion serves as the P terminal. Thus unlike the other layers 74, 78, 80, 82, the layer 76 (center layer) is discontinuous. The layer 78 serves as the N terminal. Portions of the layer 78 overlap portions of the layer 76.

A top surface of the power device 68 is electrically connected to the N terminal by wirebond or ribbon 84. A top surface of the power device 70 is electrically connected to the O terminal by wirebond or ribbon 86 that crosses over the layers 78, 82 between the power devices 68, 70. The diodes 69, 71 corresponding with the power devices 68, 70 are similarly electrically connected with the N and O terminals by wirebond or ribbon 88, 90 respectively. And, control pins 92 are electrically connected with the power devices 68, 70.

In this configuration, the P and N terminals are laminated to significantly reduce main loop stray inductance. The dashed line indicates the main loop from the P terminal to the N terminal. (The wire for the power device gate loop is bonded to the control pins 92, which are separate from the substrate 72.) The gate loop magnetic field is orthogonal to the main loop magnetic field, so the coupling of the power loop to the gate loop is minimized. If the power devices 68, 70 have reverse conducting capability, such as with Si or SiC MOSFETs or reverse-conducting (RC)-IGBTs, the diodes 69, 71 can be removed.

Other configurations are also contemplated. With reference to FIG. 5, three half-bridges 94, 96, 98 are arranged to be a six-pack power module 100 (full three-phase converter). The half-bridge 94 includes two power devices 102, 104 and associated power diodes 106, 108. The half-bridge 96 includes two power devices 110, 112 and associated power diodes 114, 116. The half-bridge 98 includes two power devices 118, 120 and associated power diodes 122, 124. Terminals A, B, C are respectively associated with the half-bridges 94, 96, 98. And, terminals P and N are common among the half-bridges 94, 96, 98. As above, if the power devices 102, 104, 110, 112, 118, 120 have reverse conducting capability, such as with Si or SiC MOSFETs or RC-IGBTs, the diodes 106, 108, 114, 116, 122, 124 can be removed.

With reference to FIGS. 6A and 6B, the power devices 102, 104, 110, 112, 118, 120 and diodes 106, 108, 114, 116, 122, 124 are attached on a substrate 126. The substrate 126 includes three metal (e.g., copper) layers 128, 130, 132 and two insulative (e.g., ceramic) layers 134, 136. The ceramic layer 134 is sandwiched between the copper layers 128, 130, and the ceramic layer 136 is sandwiched between the copper layers 130, 132. Specifically, the power devices 102, 104, 110, 112, 118, 120 are attached on the copper layer 130, which is discretely partitioned in four: three respective portions serve as the A, B, and C terminals and the fourth portion serves as the common P terminal. The layer 132 serves as the common N terminal.

A top surface of each of the power devices 102, 110, 118 is electrically connected to the N terminal by wirebond or ribbon 138, 140, 142 respectively. A top surface of the power device 104 is electrically connected to the A terminal by wirebond or ribbon 144 that crosses over the layers 132, 136 between the power devices 102, 104. A top surface of the power device 112 is electrically connected to the B terminal by wirebond or ribbon 146 that crosses over the layers 132, 136 between the power devices 110, 112. A top surface of the power device 120 is electrically connected to the C terminal by wirebond or ribbon 148 that crosses over the layers 132, 136 between the power devices 118, 120. The diodes 106, 108 corresponding with the power devices 102, 104 are similarly electrically connected with the N and A terminals by wirebond or ribbon 150, 152 respectively. The diodes 114, 116 corresponding with the power devices 110, 112 are similarly electrically connected with the N and B terminals by wirebond or ribbon 154, 156 respectively. The diodes 122, 124 corresponding with the power devices 118, 120 are similarly electrically connected with the N and C terminals by wirebond or ribbon 158, 160 respectively. And, control pins 162 are electrically connected with the power devices 102, 104, 110, 112, 118, 120.

The power modules contemplated herein, such as the power modules 66, 100, may be used within the context of an automotive vehicle. With reference to FIG. 7, a vehicle 164 may include a traction battery 166, power electronics 168, an electric machine 170, and one or more controllers 172 to communicate with and command the other components. (Solid lines indicate power flow paths.) Power can be exchanged between the traction battery 166 and electric machine 170 via the power electronics 168 to capture regenerative energy or propel the vehicle 164. The power electronics 168 (e.g., inverter, converter, etc.) may include any of the power modules contemplated herein.

The words used in the specification are words of description rather than limitation, and it is understood that various changes may be made without departing from the spirit and scope of the disclosure and claims. As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A power system comprising:
a single-side-cooled power module including a contiguous five-layer substrate of two insulative layers interleaved with three conductive layers, a center one of the conductive layers being partitioned to define discrete spaced apart positive terminal and output terminal portions, and an outer of the conductive layers defining a negative terminal portion such that the positive terminal and negative terminal portions overlap;
semiconductor devices being respectively in direct physical contact with the positive terminal and output terminal portions without directly physically contacting other of the layers; and
respective sets of wires interconnecting the output terminal portion and the semiconductor device in direct physical contact with the positive terminal portion, and interconnecting the negative terminal portion and the semiconductor device in direct physical contact with the output terminal portion.

2. The power system of claim 1, wherein the single-side-cooled power module is a half-bridge.

3. The power system of claim 1, wherein the conductive layers are metal.

4. The power system of claim 3, wherein the metal is copper.

5. The power system of claim 1, wherein the insulative layers are ceramic.

6. A power module comprising:
semiconductor devices mounted on a contiguous five-layer substrate of two insulative layers interleaved with three conductive layers, a center one of the conductive layers being partitioned to define discrete spaced apart positive terminal and output terminal portions, an outer of the conductive layers defining a negative terminal portion, and the semiconductor devices being respectively in direct physical contact with the positive terminal and output terminal portions without directly physically contacting other of the layers.

7. The power module of claim 6 further comprising wires interconnecting the output terminal portion and the semiconductor device in direct physical contact with the positive terminal portion.

8. The power module of claim 6 further comprising wires interconnecting the negative terminal portion and the semiconductor device in direct physical contact with the output terminal portion.

9. The power module of claim 6, wherein the semiconductor device and substrate are arranged to form a single-side-cooled power module.

10. The power module of claim 9, wherein the single-side-cooled power module is a half-bridge.

11. The power module of claim 6, wherein the conductive layers are metal.

12. The power module of claim 11, wherein the metal is copper.

13. The power module of claim 6, wherein the insulative layers are ceramic.

14. A power system comprising:
a single-side-cooled power module including three conductive layers alternating with two insulative layers to form a substrate, a center layer of the substrate being discretely partitioned into two portions and two semiconductor devices being respectively directly in physical contact with the two portions such that a positive terminal portion defined by one of the two portions overlaps a negative terminal portion defined by an outer most of the layers.

15. The power system of claim 14, wherein the other of the two portions defines an output terminal portion.

16. The power system of claim 15, wherein the single-side-cooled power module further includes wires interconnecting the output terminal portion and the semiconductor device in direct physical contact with the positive terminal portion.

17. The power system of claim 15, wherein the single-side-cooled power module further includes wires interconnecting the negative terminal portion and the semiconductor device in direct physical contact with the output terminal portion.

18. The power system of claim 14, wherein the single-side-cooled power module is a half-bridge.

19. The power system of claim 14, wherein the conductive layers are metal.

20. The power system of claim 14, wherein the insulative layers are ceramic.

* * * * *